United States Patent
You et al.

(10) Patent No.: US 6,870,208 B1
(45) Date of Patent: Mar. 22, 2005

(54) IMAGE SENSOR MODULE

(75) Inventors: Irving You, Hsinchu Hsien (TW); Jichen Wu, Hsinchu Hsien (TW); Hsiu Wen Tu, Hsinchu Hsien (TW); Jason Chang, Hsinchu Hsien (TW); Figo Hsieh, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 0 days.

(21) Appl. No.: 10/671,038

(22) Filed: Sep. 24, 2003

(51) Int. Cl.[7] .............................................. H01L 21/336
(52) U.S. Cl. ...................... 257/291; 257/680; 257/678; 257/686
(58) Field of Search ............................... 257/291, 680, 257/678, 686

Primary Examiner—Long Pham
(74) Attorney, Agent, or Firm—Pro-Techtor International Services

(57) ABSTRACT

An image sensor module includes a substrate, a frame layer, a photosensitive chip, a transparent layer and a lens barrel. The substrate has a plurality of lead frame arranged in a matrix to form an upper surface, which is formed with a opening, and a lower surface, which is formed with a cavity penetrated from the opening. The frame layer is integrally formed with the substrate, and arranged at the periphery of the upper surface of the substrate to define a chamber together with the substrate, an internal thread being formed on the inner wall of the chamber. The photosensitive chip is mounted within the cavity of the substrate, and electrically coupled each of the lead frames in a flip chip manner. The transparent layer is covered onto the upper surface of the substrate to cover the opening. The lens barrel has a top surface, a bottom surface opposed to the top surface and a transparent region, a external thread formed between the top surface and the bottom surface, the lens barrel being arranged within the chamber of the frame layer, the external thread being screwed on the internal thread of the chamber.

4 Claims, 2 Drawing Sheets

IMAGE SENSOR MODULE

BACKGROUND OF THE INVENTION

1. Field of the Invention

The present invention relates to an image sensor module, and more particularly to an image sensor module having a reduced manufacturing cost and package volume.

2. Description of the Related Art

Referring to FIG. 1, a conventional image sensor module includes a lens holder 10, a lens barrel 20, and an image sensor 30. The lens holder 10 has an upper face 12, a lower face 14 and an opening 16 penetrating through the lens holder 10 from the upper end face 12 to the lower end face 14. An internal thread 18 is formed on an inner wall of the opening 16 of the lens holder 10.

The lens barrel 20 formed with an external thread 22 is inserted from the upper end face 12 of the lens holder 10, received within the opening 16, and screwed to the internal thread 18 of the lens holder 10. The lens barrel 20 is formed with a transparent region 24 under which an aspheric lens 26 and an infrared filter 28 are arranged in sequence.

The image sensor 30 has a substrate 31, which is a printed circuit board. The substrate 31 has a first surface 32 formed with first connected points 34 and a second surface 33 opposite to the first surface 32 formed with second connected points 35.

The frame layer 36 is arranged at the periphery of the first surface 32 of the substrate 31.

The photosensitive chip 37 is mounted on the first surface 32 on which is electrically connected to the first connected points 34 by wires 38.

The transparent layer 39 is adhered on the frame layer 36 for covering the photosensitive chip 37 and wires 38.

The above-mentioned image sensor module has the following drawbacks.

1. Because the transparent layer 36 is bonded to the lower surface 14 of the lens holder 10 by the adhesive, which may contaminate the surface of the transparent layer 36, poor optical signals may be obtained.

2. When the module is assembled, the transparent layer 36 has to be precisely positioned with the aspheric lens 26 and then bonded to the lens barrel 20. Once the positional precision deviates from the standard level, the overall module cannot be reassembled and has to be treated as waste material.

3. The lens holder 10 has to be additionally provided to combine the lens barrel 20 with the image sensor 30.

4. The substrate 31 is a printed circuit board, which has a higher cost.

SUMMARY OF THE INVENTION

It is an important subject of the present invention to provide an improved structure for an image sensor module, which is easy to be assembled/disassembled and has less components.

It is another object of the present invention is to provide an image sensor module, which may be advantageously reduced the volume of the package.

It is still another object of the present invention is to provide an image sensor module, which may be omitted the printed circuit board and has a reduced manufacturing cost.

To achieve the above-mentioned object, the present invention of an image sensor module includes a substrate, a frame layer, a photosensitive chip, a transparent layer and a lens barrel. The substrate has plurality of lead frames, each of the lead frames has a first board and a second board located on a height different from that of the first board, the substrate is formed with an upper surface, which is formed with a opening, and a lower surface, which is formed with a cavity penetrated from the opening, each of the first board of the lead frames are exposed from the cavity, and each of the second board of the lead frames are exposed from the lower surface of the substrate. The frame layer is integrally formed with the substrate, and is arranged at the periphery of the upper surface of the substrate to define a chamber together with the substrate, an internal thread is formed on the inner wall of the chamber. The photosensitive chip is mounted within the cavity of the substrate, and is electrically coupled each of the first boards of the lead frames in a flip chip manner. The transparent layer is covered onto the upper surface of the substrate to cover the opening, therefore, the photosensitive chip may received optical signals passing through the transparent layer. The lens barrel has a top surface, a bottom surface opposed to the top surface and a transparent region, a external thread is formed between the top surface and the bottom surface, the lens barrel is arranged within the chamber of the frame layer, the external thread being screwed on the internal thread of the chamber.

Furthermore, the present invention which is easy to be assembled/disassembled and has less components, then, it may be advantageously reduced the volume of the package and has less manufacturing cost

DETAILED DESCRIPTION OF THE INVENTION

Figure 1:
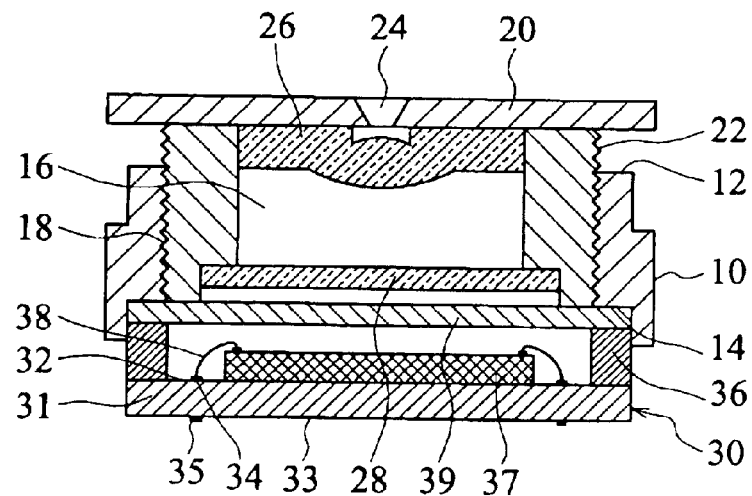
FIG. 1 is a schematic illustration showing a conventional image sensor module.
Figure 2:
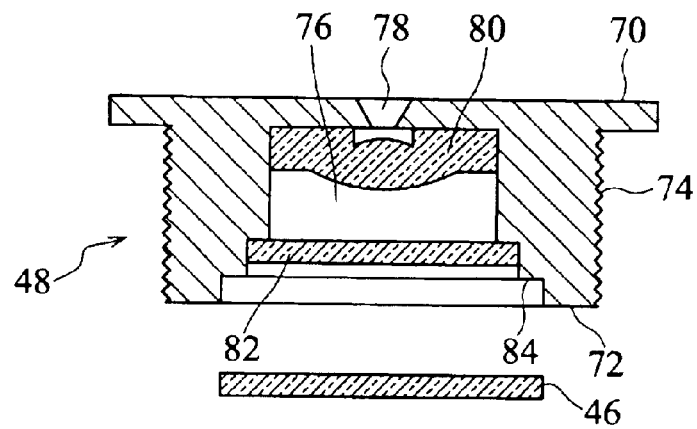
FIG. 2 is exploded view showing an image sensor module of the present invention.
Figure 2:
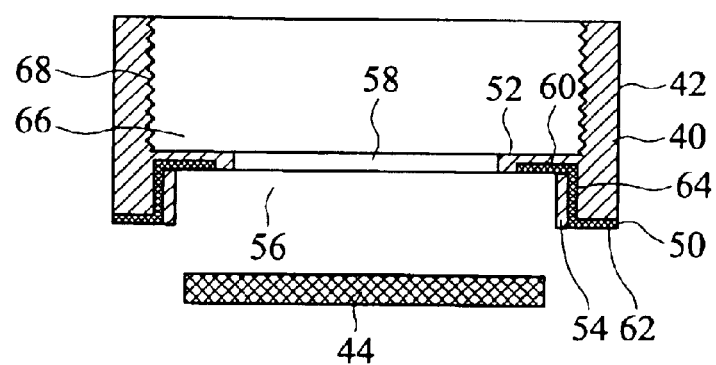
Figure 3:
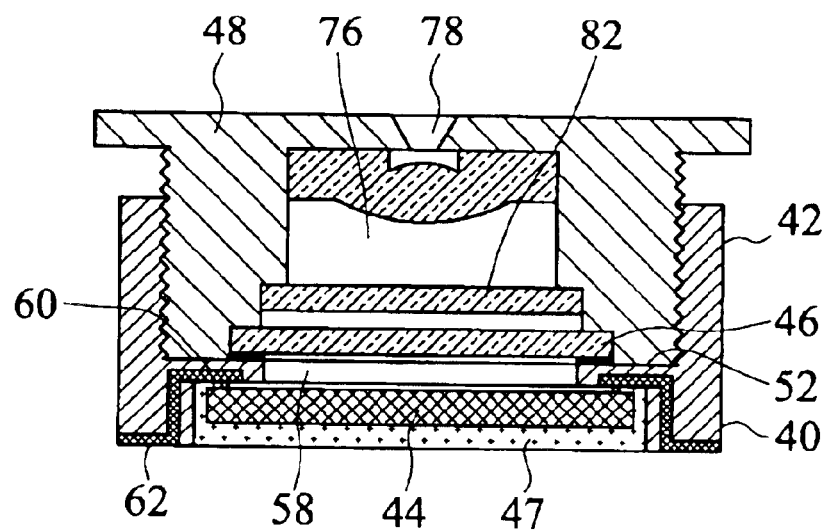
FIG. 3 is a cross-section showing an image sensor module of the present invention.

Please referring to FIG. 2 and FIG. 3, an image sensor module of the present invention includes a substrate 42, a photosensitive 44, a transparent layer 46, a molded resin 47 and a lens barrel 48.

The substrate 42 has a plurality of lead frames 50 arranged in a matrix, each of the lead frames 50 have a first board 60 and a second board 62 located on a height different from that of the first board 60, the substrate 42 is forming with an upper surface 52, which is formed with a opening 58, and a lower surface 54, which is formed with a cavity 56 penetrated from the opening 54, each of the first board 60 of the lead frames 50 are exposed from the cavity 56 to define signal input terminals, and each of the second board 62 of the lead frames 50 are exposed from the lower surface 54 of the substrate 40 to define signal output terminals, wherein a third board 64 is coupled the first board 64 to the second board 62.

The frame layer 42 is integrally formed with the substrate 40 by way of injecting mold, and is arranged at the periphery of the upper surface 52 of the substrate 40 to define a chamber 66 together with the substrate 40, an internal thread 68 is formed on the inner wall of the chamber 66.

The photosensitive chip 44 is arranged within the cavity 56 and electrically connected to the first board 60 of the lead frame 50 in a flip chip manner.

The transparent layer 46 is a piece of glass adhered onto the upper surface 52 of the substrate 40 to cover the opening 58, therefore, the photosensitive chip 44 may received optical signals passing through the transparent layer 46.

The molded resin 47 is filled into the cavity 56 of the substrate 40 for covering the photosensitive chip 44.

The lens barrel 48 has an upper end face 70, a bottom end face 72 opposed to the upper end face 70 and a transparent region 76. A external thread 74 is formed between the upper end face 70 and the bottom end face 72. The lens barrel 48 is arranged within the chamber 66 of the frame layer 42, the external thread 74 of the lens barrel 48 is screwed on the internal thread 68 of the chamber 66. A through hole 78 communication with the transparent region 76 is formed at the upper end face 70 of the lens barrel 48, and an aspheric lens 80 and an infrared filter 82 under the aspheric lens 80 is arranged within the transparent region 76 of the lens barrel 48.

Figure 4:
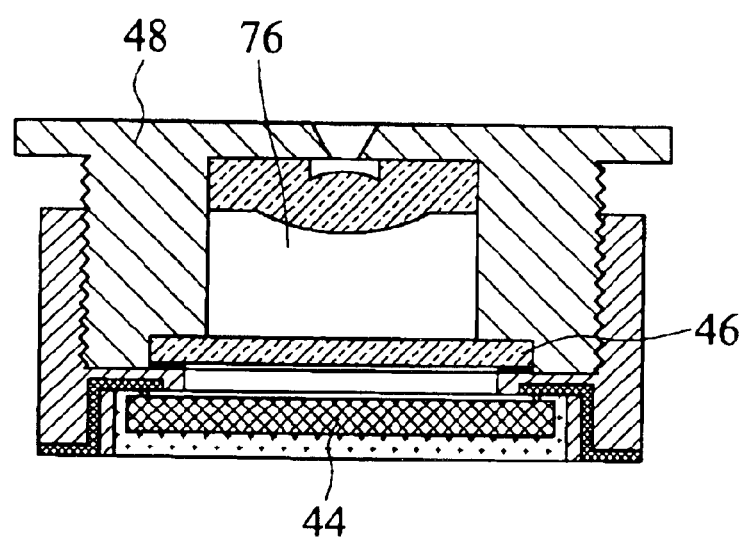
FIG. 4 is a second schematic illustration showing an image sensor module of the present invention

Please referring to FIG. 4, which is a second schematic illustration showing an image sensor module of the present invention, wherein the transparent layer 46 and the infrared filter 82 are combined, therefore, the transparent layer 46 may be omitted.

To sum up, the present invent has the following advantages.

1. Since the frame layer 42 and the lens barrel 48 are screwed together through the external thread 74 and internal thread 68, the module is easy to be assembled/disassembled so as to facilitate the replacement of the components and the source recycling.

2. Since the conventional lens holder is omitted, the product size may be reduced.

3. Since the substrate 40 and the frame layer 42 are integrally formed by injecting mold, and an internal thread 68 is formed on the frame layer 42, therefore, the module may be omitted.

4. Since the substrate 40 is consist of a plurality of lead frames 30 so as to may reduced the manufacturing cost.

While present the invention has been described by way of an example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. An image sensor module comprising:

a substrate having plurality of lead frames arranged in a matrix, each of the lead frames having a first board and a second board located on a height different from that of the first board, the substrate forming with an upper surface, which is formed with a opening, and a lower surface, which is formed with a cavity penetrated from the opening, each of the first board of the lead frames exposed from the cavity, and each of the second board of the lead frames exposed from the lower surface of the substrate;

a frame layer integrally formed with the substrate, and arranged at the periphery of the upper surface of the substrate to define a chamber together with the substrate, an internal thread being formed on the inner wall of the chamber;

a photosensitive chip mounted within the cavity of the substrate, and electrically coupled each of the first boards of the lead frames in a flip chip manner;

a transparent layer covered onto the upper surface of the substrate to cover the opening, therefore, the photosensitive chip may received optical signals passing through the transparent layer; and a lens barrel having a top surface, a bottom surface opposed to the top surface and a transparent region, a external thread formed between the top surface and the bottom surface, the lens barrel being arranged within the chamber of the frame layer, the external thread being screwed on the internal thread of the chamber.

2. The image sensor module according to claim 1, wherein a through hole communication with the transparent region is formed at the upper end face of the lens barrel, and an aspheric lens and an infrared filter under the aspheric lens is arranged within the transparent region of the lens barrel.

3. The image sensor module according to claim 1, wherein the transparent layer is a piece of glass.

4. The image sensor module according to claim 1, further comprises a molded resin, which is filled within the cavity of the substrate to protect the photosensitive chip.

\* \* \* \* \*